(12) United States Patent
Kumar

(10) Patent No.: US 7,436,201 B2
(45) Date of Patent: Oct. 14, 2008

(54) ARCHITECTURE FOR REDUCING LEAKAGE COMPONENT IN SEMICONDUCTOR DEVICES

(75) Inventor: Ashish Kumar, Jharkhand (IN)

(73) Assignee: STMicroelectronics Pvt Ltd., Uttar Pradesh (IN)

( * ) Notice: Subject to any disclaimer, the term of this patent is extended or adjusted under 35 U.S.C. 154(b) by 0 days.

(21) Appl. No.: 11/618,116

(22) Filed: Dec. 29, 2006

(65) Prior Publication Data

US 2007/0200617 A1    Aug. 30, 2007

(51) Int. Cl.
*H03K 17/16* (2006.01)

(52) U.S. Cl. .......................... 326/27; 326/83

(58) Field of Classification Search ............... 326/26, 326/27, 82–87, 93, 21
See application file for complete search history.

(56) References Cited

U.S. PATENT DOCUMENTS

| 6,046,604 | A  | * | 4/2000  | Horiguchi et al. | 326/83 |
| 7,292,061 | B2 | * | 11/2007 | Oh | 326/33 |
| 2003/0038653 | A1 | * | 2/2003 | Ooishi et al. | 326/33 |

* cited by examiner

*Primary Examiner*—Don P Le
(74) *Attorney, Agent, or Firm*—Lisa K. Jorgenson; Allen, Dyer, Doppelt, Milbrath & Gilchrist

(57) ABSTRACT

An architecture for reducing leakage component in semiconductor devices using a gated power supply is based on the supply being split into two parts. An alternate inverter is connected to a different power rail derived from the same single power rail. The power rails are enabled and disabled according to the value of a standby signal and an input signal. The standby signal is high in the standby mode and low in the active mode.

12 Claims, 3 Drawing Sheets

US 7,436,201 B2

ARCHITECTURE FOR REDUCING LEAKAGE COMPONENT IN SEMICONDUCTOR DEVICES

FIELD OF THE INVENTION

The present invention relates to an architecture for reducing leakage currents in semiconductor devices, and more particularly, to leakage reduction for buffer chain structures.

BACKGROUND OF THE INVENTION

In a highly integrated system, a large number of modules are idle at any given time. The ever increasing reduction in threshold voltage, channel length and gate oxide thickness has resulted in a significant increase in the leakage current of idle devices. This increase in leakage current significantly undermines the reduction in power consumption. As a result, both the static and dynamic power consumption of the system remains significantly high. This factor is assuming increasing importance in large System-On-Chip (SoC) devices. In deep submicron technologies involving several million gates, static power dissipation itself becomes comparable to or more than the dynamic power. Every attempt is therefore made to reduce the static leakage component for sleep as well as dynamic modes, especially for low power applications.

A major contributor of leakage current in a very large variety of digital systems are the buffer chains used to buffer the signals going out of the device to the pads. These buffer chains comprise large transistors due to the relatively higher current levels that are required to be handled by them. Due to their larger size, the leakage currents in these chains are relatively large. Buffer chains are ordinarily turned off when in a tri-state mode or when the pad is selected for an input mode. Currently, buffer chains are generally powered on with the help of power gating circuits.

Power gating is a well known feature specifically used to reduce leakage power in semiconductor devices. In the power gating technique a sleep transistor is introduced between the power supply source and circuits fed by the power source. These sleep transistors are turned off in the sleep mode to provide isolation from the power supply and cut off the supply leakage path. FIG. 1 shows isolation of a logic module from a power supply with the help of a gating transistor as known in the prior art. Control (11) is applied to the gating transistor (12) that delivers power to the logic block (13).

A similar arrangement uses a diode connected in parallel with the device to maintain the logic value between a reduced logic high and the low value. The ground connection can also be gated with such an arrangement. However, implementation of this arrangement results in a large area overhead and is difficult to apply for all the components of the design. Complete power gating without the use of diodes results in data loss, and requires the reinitialization of the system resulting in a large reactivation time.

SUMMARY OF THE INVENTION

An object of the present invention to provide a system and method for reducing leakage current in buffer chains without incurring a significant area overhead.

Another object of the present invention to provide a system and method for reducing leakage current in buffer chains without resulting in increased reactivation time.

To achieve the above objects, a circuit arrangement provides multiple controlled supply voltage rails each of which supplies power to a subset of buffer elements in the buffer chain. During power down a selected one or more of these supply voltages are deactivated while other supply voltages are kept active so as to retain logic levels while during the active state all the supply voltage rails are made active.

Accordingly, a digital buffer chain with reduced leakage current during power down comprises a plurality of controlled supply voltage rails each connected to the supply terminals of a separate group of one or more buffers in the chain. Supply voltage enabling means has an input connected to the power down input of the buffer chain, and an output connected to the control inputs of the controlled supply voltage rails. This is so that the power to a selected set of the supply voltage rails is maintained when the buffer chain is powered down while all supply voltage rails are enabled when the buffer chain is active.

The supply voltage enabling means may comprise a storage cell having an input connected to the power down input of the buffer chain, and a passgate. The passgate may have an input connected to the power supply, and an output connected to the supply voltage rails that are switched off whenever the buffer chain is disabled. Its control input is connected to the output of the storage cell.

Another aspect of the invention is directed to a method for reducing leakage current in digital buffer chains having a power down facility, comprising the steps of partitioning the supply voltage rail of the buffer chain into a plurality of supply voltage rails each feeding power to a nonoverlapping subset of buffers in the buffer chain, and enabling power to only a few of the supply voltage rails when the buffer chain is powered down. Power is also enabled to all the supply voltage rails when the buffer chain is active. The enabling of the power may comprise generating at least one intermediate signal using the input signal, generating at least one control signal using the intermediate signal, and enabling and disabling the supply voltage rails according to the control signal.

BRIEF DESCRIPTION OF THE DRAWINGS

An embodiment of the present invention is described with the help of following drawings.

DETAILED DESCRIPTION OF THE PREFERRED EMBODIMENTS

Figure 1:
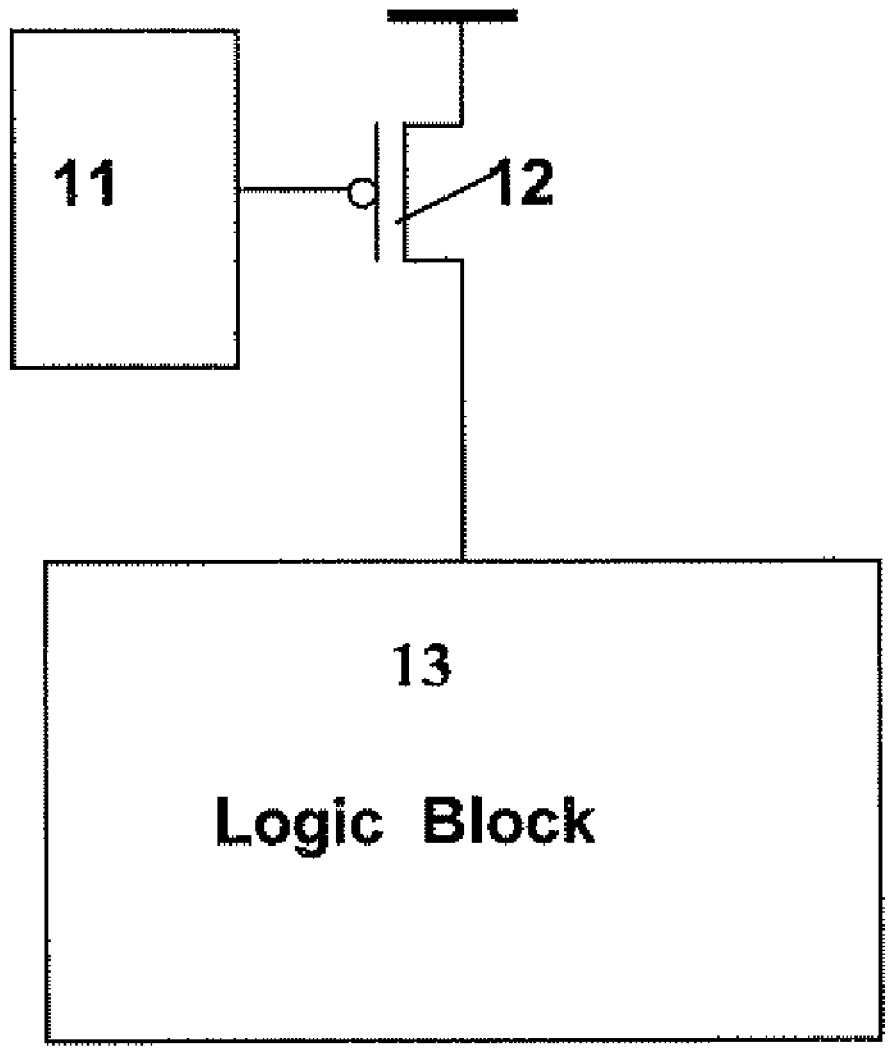
FIG. 1 illustrates isolation of a logic module from a power supply via a gating transistor according to the prior art.
Figure 2:
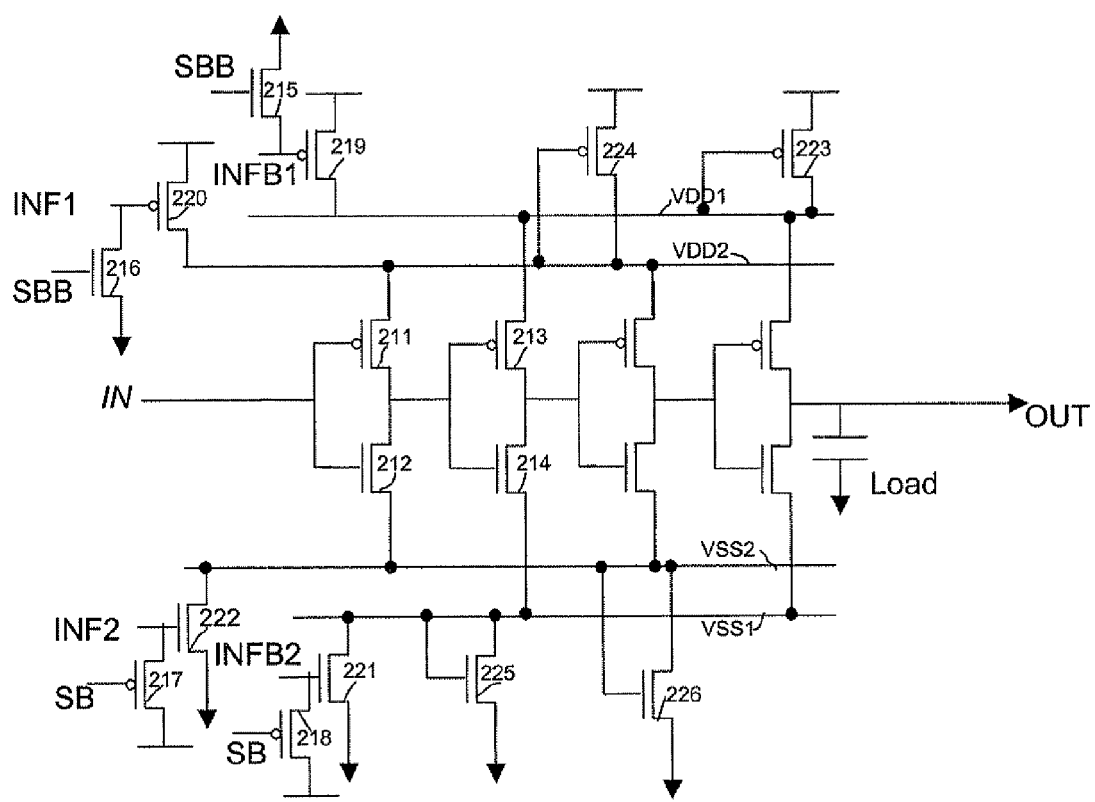
FIG. 2 is a schematic diagram showing a split power supply scheme applied for both the source and sink according to the present invention.

FIG. 2 illustrates the split power supply scheme applied for both the source and sink according to an embodiment of the present invention.

Input IN is connected to the inverter chain input, which is formed by the transistors (211,212). Alternate inverters are connected to the power rails VDD1 and VDD2 for source and to VSS1 and VSS2 for sink. Signal SB is an active high STANDBY signal when the logic is kept in a standby mode. In the standby mode transistors (215,216,217,218) are in the off state. Power supply transistors (219,220,221,222) are controlled by the input signal. Depending on the input value IN, only one of two power rails VDD1, VDD2 and one of the VSS1, VSS2 ground rails are powered while the other is cut off. If the active mode signal SB is low, then all four power rails are driven to their respective full values. Optional diodes (223,224,225,226) are connected to the power rails when excessive discharge of VDD or excess charging of VSS nodes are desired so as to reduce recovery time from standby to active mode. Although only four inverter stages are shown in FIG. 2, the scheme holds valid for a series of inverter chains of any size.

Figure 3:
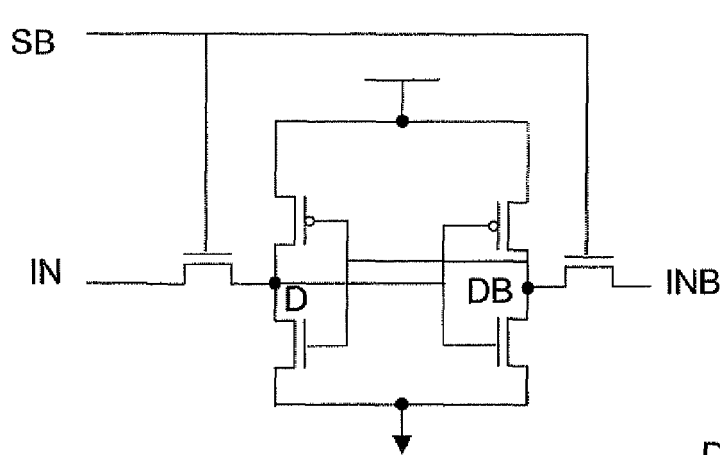
FIG. 3 is a schematic diagram showing in detail the intermediate signal generation using an input signal and a standby signal according to the present invention.

FIG. 3 is a schematic diagram showing in detail the intermediate signal generation using the input signal and the standby signal. Power supply transistors (219,220,221,222) are controlled by input signal IN which is sampled at the memory cell nodes to generate intermediate signals D and DB.

Figure 4:
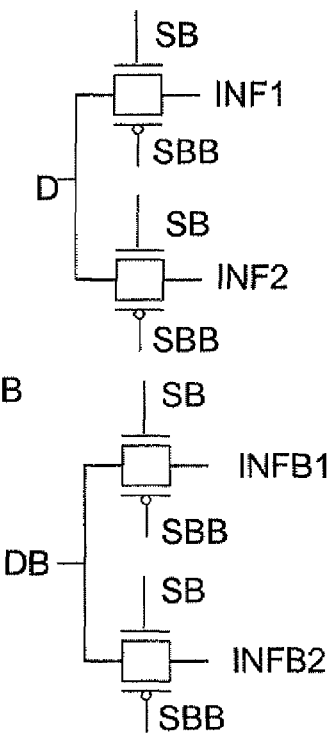
FIG. 4 is a schematic diagram showing in detail the generation of final control signals from the intermediate signals to control enabling of the power supply rails according to the present invention.

FIG. 4 illustrates the generation of final control signals from the intermediate signals in order to control the enabling of the power supply rails. The intermediate signals D and DB are connected to passgates, which in turn are controlled by the standby mode signal SB and its inverse SBB.

When the input is 1 (logic high) during standby mode, signal D is also logic high and DB is low. These values are passed to the passgate inputs making INF1 and INF2 as logic high with INFB1 and INFB2 being logic low. These values are in turn provided to the gates of the transistors (219,220, 221,222). Under this condition INF1 disables power rail VDD2 and INF2 enables power rail VSS2. Similarly, INFB1 enables power rail VDD1 and INFB2 disables power rail VSS1. Transistors responsible for leakage (211,214) and so on. Both, the source of transistor (211) and the sink of transistor (214) are cut off, thus reducing the leakage significantly.

Another advantage of using this architecture is that the scheme maintains a logic value to its full value for all nodes during the standby mode also. Control components, the memory cell, passgates and transistors (215,216,217,218) are small transistors. The diodes are also small. However transistors (219,220,221,222) are large as they are required to deliver current to large inverters. Also, nodes VDD1, VDD2, VSS1 and VSS2 are connected to required decoupling capacitors. Additional control components thus occupy a small area, and their leakage can be minimized. The scheme is applied to a series of inverters. In one measurement, the leakage using the prior art arrangement was found to be 603 nA while using the new scheme the leakage is reduced to 30 nA.

The present invention is not intended to be restricted to any particular form or arrangement, or any specific embodiment, or any specific use disclosed herein, and may be modified in various particulars or relations without departing from the spirit or scope of the claimed invention shown and described above. The apparatus or method shown are intended only for illustration and disclosure of an operative embodiment and not to show all of the various forms or modifications in which this invention might be embodied or operated.

That which is claimed:

1. An integrated circuit comprising:
    a digital buffer chain arranged into respective groups of buffers, said digital buffer chain comprising a power down input for switching to an inactive state, each buffer group comprising at least one buffer and at least one supply terminal;
    a plurality of controlled supply voltage lines, each controlled supply voltage line comprising a control input and being coupled to the at least one supply terminal of a respective buffer group; and
    a supply voltage controller having an input coupled to the power down input of said digital buffer chain, and an output coupled to the control inputs of said plurality of controlled supply voltage lines so that power to at least one of the supply voltage lines is disabled when said digital buffer chain is in the inactive state while power to the other controlled supply voltage lines is enabled.

2. An integrated circuit according to claim 1, wherein said supply voltage controller comprises:
    a storage cell having an input coupled to the power down input of said digital buffer chain, and an output; and
    a passgate having an input coupled to a power supply, an output coupled to said controlled supply voltage lines that are switched off when said digital buffer chain is in the inactive state, and a control input coupled to the output of said storage cell.

3. An integrated circuit according to claim 2 wherein each buffer comprises an inverter.

4. An integrated circuit comprising:
    a digital buffer chain comprising a plurality of buffers coupled together, said plurality of buffers being arranged into first and second buffer groups with each buffer comprising a supply terminal, said digital buffer chain comprising a power down input for switching to an inactive state;
    a plurality of controlled supply voltage lines comprising a first controlled supply voltage line coupled to the supply terminals of the first buffer group, and a second controlled supply voltage line coupled to the supply terminals of the second buffer group, each controlled supply voltage line comprising a control input; and
    a supply voltage controller having an input coupled to the power down input of said digital buffer chain, and an output coupled to the control inputs of said plurality of controlled supply voltage lines so that power to the first controlled supply voltage lines is disabled when said digital buffer chain is in the inactive state while power to the second controlled supply voltage line is enabled.

5. An integrated circuit according to claim 4, wherein said supply voltage controller comprises:
    a storage cell having an input coupled to the power down input of said digital buffer chain, and an output; and
    a passgate having an input coupled to a power supply, an output coupled to the first controlled supply voltage line that is switched off when said digital buffer chain is in the inactive state, and a control input coupled to the output of said storage cell.

6. An integrated circuit according to claim 4, wherein each buffer comprises an inverter.

7. A method for reducing leakage current in a digital buffer chain comprising a plurality of buffers and a controlled supply voltage line, with the controlled supply voltage line being partitioned into a plurality of controlled supply voltage lines each providing power to a group of buffers in the digital buffer chain, the method comprising:
    disabling at least one of the plurality of controlled supply voltage lines when the digital buffer chain is in an inactive state while power to the other supply voltage lines is enabled.

8. A method according to claim 7, wherein the disabling comprises:
    grating at least one intermediate signal using an input signal; and
    grating at least one control signal using the at least one intermediate signal for the disabling of the at least one of the plurality of controlled supply voltage lines.

9. A method according to claim 7, wherein each buffer comprises an inverter.

10. A method for reducing leakage currents in an integrated circuit comprising a digital buffer chain comprising a plurality of buffers and a power down input for switching to an inactive state, the method comprising:
separating the plurality of buffers into first and second buffer groups, each buffer group comprising at least one buffer and at least one supply terminal;
coupling a first controlled supply voltage line to the supply terminals of the first buffer groups, each controlled supply voltage line comprising a control input;
coupling a second controlled supply voltage line to the supply terminals of the second group of buffers, each controlled supply voltage line comprising a control input; and
providing a supply voltage controller having an input coupled to the power down input of the digital buffer chain, and an output coupled to the control inputs of the first and second controlled supply voltage lines so that power to the first controlled supply voltage line is disabled when the digital buffer chain is in the inactive state while power to the second controlled supply voltage line is enabled.

11. A method according to claim 10, wherein the supply voltage controller comprises a storage cell having an input coupled to the power down input of the digital buffer chain; and a passgate having an input coupled to a power supply, an output coupled to the first controlled supply voltage line that is switched off when the digital buffer chain is in the inactive state, and a control input coupled to an output of the storage cell.

12. A method according to claim 10, wherein each buffer comprises an inverter.

* * * * *

UNITED STATES PATENT AND TRADEMARK OFFICE
CERTIFICATE OF CORRECTION

PATENT NO. : 7,436,201 B2  Page 1 of 1
APPLICATION NO. : 11/618116
DATED : October 14, 2008
INVENTOR(S) : Ashish Kumar It is certified that error appears in the above-identified patent and that said Letters Patent is hereby corrected as shown below:

Title Page, (30) Foreign Application Priority Data    Insert: --Dec. 30, 2005 (IN) 3545/DEL/2005--

Column 2, Line 40    Delete: "of following"
Insert: --of the following--

Column 4, Line 17    Delete: "claim 2"
Insert: --claim 1--

Column 4, Line 36    Delete: "lines"
Insert: --line--

Signed and Sealed this

Twenty-third Day of December, 2008

JON W. DUDAS
*Director of the United States Patent and Trademark Office*